United States Patent [19]
Welter

[11] 3,959,651
[45] May 25, 1976

[54] ELECTRON MICROSCOPE

[75] Inventor: Leonard M. Welter, Saratoga, Calif.

[73] Assignee: American Optical Corporation, Southbridge, Mass.

[22] Filed: Apr. 24, 1974

[21] Appl. No.: 463,629

[52] U.S. Cl. .............................. 250/310; 250/311; 315/31 R
[51] Int. Cl.² ........................................ H01J 37/26
[58] Field of Search ............... 315/31 R, 31 TV; 250/310, 311

[56] References Cited
UNITED STATES PATENTS

| | | | |
|---|---|---|---|
| 2,234,281 | 3/1941 | Ruska | 250/311 |
| 3,206,635 | 9/1965 | Phillips | 315/31 R |
| 3,223,837 | 12/1965 | Shapiro et al. | 250/310 |
| 3,760,383 | 9/1973 | Wolfe | 315/31 R |

Primary Examiner—Richard A. Farley
Attorney, Agent, or Firm—H. R. Berkenstock, Jr.; William C. Nealon

[57] ABSTRACT

In a field emission charged particle microscope having a housing defining a vacuum chamber, a field emission tip disposed in the chamber for generating charged particles, electrode means for establishing electrostatic focusing and accelerating field for forming a beam of charged particles, field electrode means in juxtaposition with the tip for developing an electrostatic field for extraction of charged particles generated by the tip and voltage means connected to the electrode means and the tip for supplying electrical potential thereto to establish the electrostatic fields, the inclusion of an apertured, conductive symmetrical glass resistor disposed intermediate the field electrode means and the electrode means for establishing the focusing and accelerating field, and in electrical contact therewith.

4 Claims, 6 Drawing Figures

ELECTRON MICROSCOPE

Background of the Invention

The present invention relates generally to electron optical systems and particularly to field emission electron optical systems. By definition herein, references to an electron optical system and a field emission electron optical system shall not be limited solely to those systems wherein charged particles which form the beam are electrons. Rather, reference generally to those systems shall include also systems in which the emitted charged particles are ions.

As examples of field emission electron optical systems in which the present invention is useful, reference is made to U.S. Pat. No. 3,678,333 and Applications for Letters Patent Ser. No. 224,362, filed Feb. 7, 1972 (now U.S. Pat. No. 3,766,427) (a division of U.S. Pat. No. 3,678,333) and Ser. No. 255,970 filed Feb. 14, 1972, (a Continuation-in-part of U.S. Pat. No. 3,678,333) (now abandoned in favor of continuing applications Ser. No. 537,996; 537,879, now U.S. pat. No. 3,925,664; 537,876; and 537,880, now U.S. pat. No. 3,931,517 all filed Jan. 2, 1975) all commonly assigned to the assignee of the present invention. The electron optical system disclosed in the aforementioned references include disclosures of systems including: a field emission tip for generating charged particles; electrode means for establishing an electrostatic focusing and accelerating field for forming the charged particles into a beam (often referred to as a first and second anode); field electrode means for establishing an electrostatic field for extracting the charged particles from the tip (often illustrated and referred to as an extraction electrode or an intermediate electrode, being disposed intermediate the tip and the first anode and in juxtaposition to the tip); and voltage supply means connected to the tip, the focusing and accelerating electrode means and the field electrode means to supply electrical potential between the named elements to establish the electrostatic fields.

One of the common objectives of the aforementioned inventions is the protection of the field emission tip from high voltage discharges to various structures in the field emission electron optical system. The inevitable result of such direct high voltage discharge between the biased tip (a pointed fine wire of a material such as tungsten) and ground potential is a transient high discharge current and subsequent melting or destruction of the tip. This discharge problem remained an obstruction to a commercially acceptable field emission electron microscope for serveral years until solved by one or more of the aforementioned inventions.

As disclosed in applications Ser. Nos. 224,362 and 255,970, substantial improvements in the field emission gun performance were achieved by the inclusion of a field emission electrode incorporated in addition to the focusing and accelerating electrode means. In one embodiment of the field emission gun, this electrode is preferably maintained at the voltage of the first anode of the focusing and accelerating electrode means by being electrically connected to it through a voltage dropping resistor (Reference No. 83 of U.S. Pat. No. 3,678,333 and Reference No. 34 of application Ser. No. 225,970). It must be appreciated, however, that in spite of the substantial benefit gained by the isolation of the tip and electrode means of the voltage dropping device, its inclusion does not contribute to the overall physical and electrical symmetry of the field emission gun. It is to be further recognized that, in the instances of high vacuum and high voltages which exist in electron microscopes, such unsymmetrical construction can either disrupt existing necessary electric fields or introduce local undesirable fields. Such localized disruptions occur through unwanted electrostatic charging of the parts in the existing fields or by unsymmetric or sharp projections which are subjected to the influence of the existing fields and may develop localized undesirable characteristics due to the geometry of the projection.

The present invention overcomes many of these unfavorable factors while providing the sought advantages of protection of the field emission tip.

Summary of the Invention

In accordance with certain features of the invention, there is provided a field emission gun for use in a charged particle microprobe system, having disposed between apertured electrical field-producing electrodes, an apertured resistive electrical conductor in electrical contact with said electrodes which is physically and electrically symmetrical about an axis whereby, by controlling the amount of resistance exhibited by the conductor, the degree of electrical isolation between the electrodes may be controlled.

Description of a Preferred Embodiment

Figure 1:
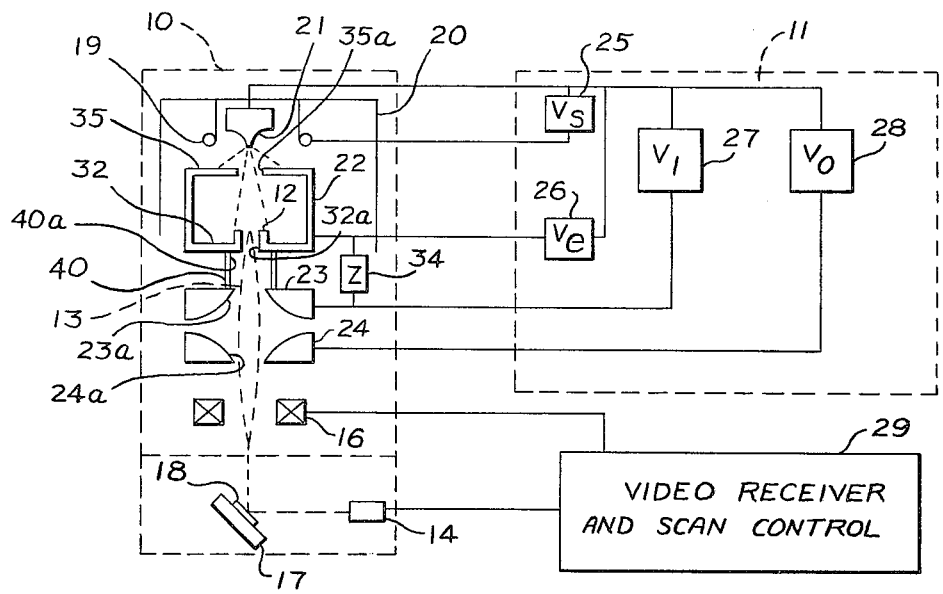
FIG. 1 is a functional schematic drawing of a field emission microprobe, embodying the present invention.

Referring now to the drawings and specifically FIG. 1, reference number 10 indicates a scanning charged particle microprobe, such as a field emission scanning electron microscope in which the present invention is illustrated. It is important to note that while the present disclosure speaks principally in terms of electron microscopes, it is quite feasible and practical that a preferred embodiment of the invention be included in a positively charged particle microprobe. To this extent, the source of particles could also be of the field emission type, and producing ions. In this field emission context, most of the voltages producing the extraction fields and the focusing and accelerating fields will be reversed to those illustrated and it may be necessary to admit an ionizable gas to the vacuum chamber.

Ancillary to the scanning electron microscope illustrated, there is shown a potential source of voltage means 11, which provides the various levels of operating voltages to the electrodes of the scanning electron microscope 10. In a second unit 29, the video scanning and detector portions of the scanning electron microscope 10 display the desired view of the specimen under interrogation by synchronizing the scan of the microscope beam to the display in a predetermined raster, as described in the aforementioned patent and applications.

In a field emission type of scanning electron microscope (SEM) the field emission tip constitutes a principal feature of the SEM. Tip 21 produces a highly coherent, high intensity beam 13 of electrons capable of being readily focused and imaged as a very small spot upon the surface of a specimen 18. Specimen 18 is shown mounted on a specimen holder 17, which in conjunction with structure not shown, but well-known in the art, positions specimen 18 with respect to the focused beam 13 of charged particles (electrons). An extraction electrode 22 is disposed in juxtaposition to field emission tip 21 and when impressed with a voltage (Ve) causes the requisite electrical field to initiate field emission. When a positive voltage is applied to electrode 22 relative to tip 21, field emission of electrons is accomplished. Disposed downstream of extraction electrode 22 are the main focusing and accelerating electrodes (23 and 24) of a field emission system. Electrode 23 serves as the first anode in the SEM and is often maintained at a potential approximately equal to that of the extraction electrode by voltage source $V_1$ (which may be a separate source or the same as Ve). Operating in conjunction with first anode 23 is second anode 24. Voltage source Vo is connected to second anode 24 and applies the main accelerating voltage thereto. In the usual arrangement of a field emission SEM, second anode is maintained generally at ground potential and tip 21 is maintained in a highly negative potential (such as 20Kv). Electrode 22 and anode 23 are maintained negative at approximately 13 to 19 Kv depending upon the particular mode of operation of the field emission SEM. Thus, there exists between anode 23 and anode 24 the main focusing and accelerating field produced by the relative different potentials on the electrodes 23 and 24.

Figure 2:
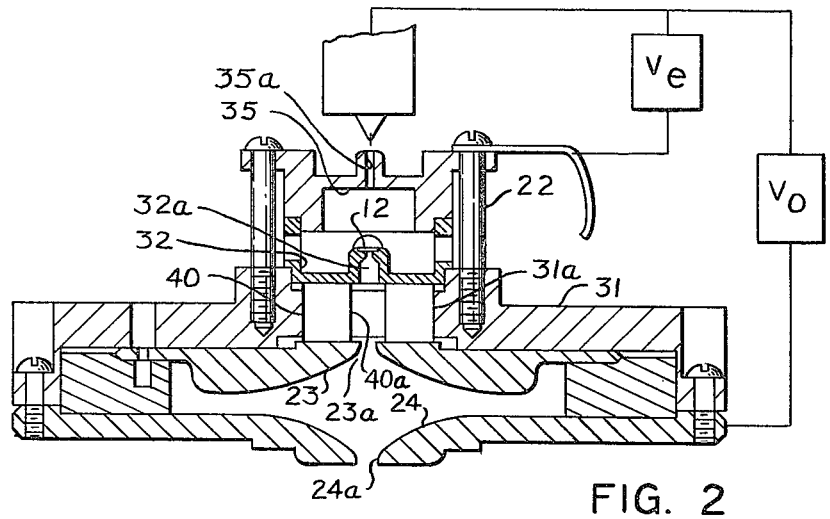
FIG. 2 is a partial cross-sectional view of a typical field emission scanning electron microscope including the present invention.

Electrons (in an SEM) are thus extracted from tip 21 in beam 13 and pass through apertures 22a, 23a and 24a in electrode 22 and anodes 23 and 24, to be finally focused upon specimen 18. In the embodiment of SEM illustrated, extraction electrode 22 includes two main members 32 and 35 (See FIG. 2). Upper member 35 is disposed in juxtaposition to field emission tip 21 and includes a wide angle aperture 35a centrally aligned with apertures 23a and 24a. Lower member 32 is disposed below member 35 and in relatively close position to anode 23. Lower member 32 includes a centrally located aperture 32a, also aligned with apertures 23a and 24a, as well as 35a. As explained in co-pending Patent application Ser. No. 225,970, aperture 32a is of a substantially smaller diameter and serves to define the size of beam 13 which is focused on specimen 18. One of the many purposes of this defining aperture is to minimize the opportunity of beam 13 impinging upon SEM elements downstream. Reference to FIG. 2 a showing previous construction illustrates the potential of the beam 13 striking such elements as anode 23 and insulator 31 (described in the aforementioned Patent Application).

Figure 2A:
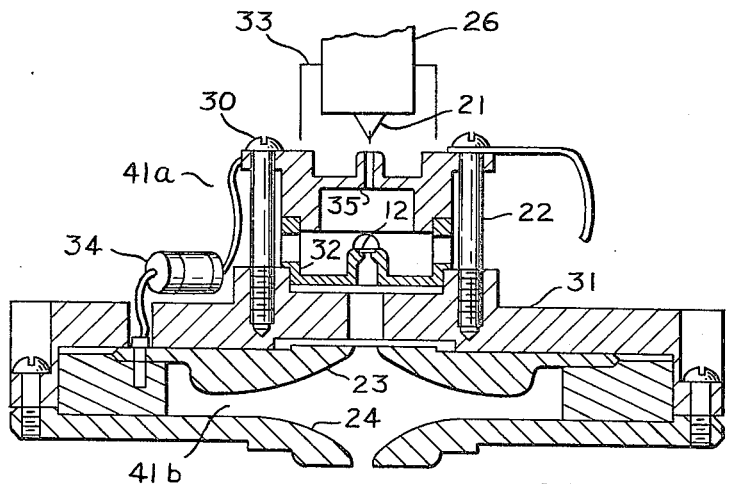
FIG. 2a is a partial cross-sectional view of a typical field emission scanning electron microscope illustrating the art prior to the present invention.

Further reference to FIG. 2a illustrates that in previous embodiments of the invention including extraction electrode 22 and first 23 and second 24 anode, electrode 22 is shunted to anode 23 through resistor 34. As explained in the previously cited patents, resistor 34 serves to connect, yet isolate, extraction electrode 22 and thus tip 21 from anode 23 for the infrequent occasions where anode 23 shorts to ground (anode 24). Without such isolation as provided by the advances of the art as described in the above cited patents, a truly stable reliable commercial field emission SEM was not previously known. While the inclusion of a separate extraction electrode 22, and the isolation of first anode 23 and electrode 22 (via impedance 34) provided a remarkable improvement in the stability and reliability of the field emission SEM, further reference to FIG. 2 and the subsequent description will illustrate the importance and extent of the present invention.

Disposed intermediate lower extraction electrode member 32 and first anode 23 is a bulk resistor 40, geometrically symmetrical about an axis coincident with beam 13. Resistor 40 has physical properties of material stability in high vacuum and when bombarded by charged corpuscular particles. In the embodiment illustrated, it is generally cylindrical in shape and composed of a conductive glass material, disclosed in Patent application Ser. No. 463,628 being filed in the name of Emil W. Deeg et. al. concurrently herewith, and now abandoned. Resistor 40 includes an axial, centrally aligned aperture 40a aligned with apertures 22a, 23a, and 24a. Resistor 40 is disposed in insulator 31 in an axial bore 31a, also generally centrally located therein. As described in aforementioned application Ser. No. 463,628, the resistance of the conductive glass is proportional to the length of the current path (which in the present embodiment is generally parallel to the beam 13, being the path between anode 23 and electrode member 32) and inversely proportional to the crosssectional area of the current path. In the illustrated embodiment in an SEM, the preferred value of resistance is approximately 40 megohms. This value has been found effective to limit the flow of current from the first anode to the extraction electrode and maintain the predetermined voltage Ve of the extraction electrode 22 with respect to the tip 21 during any occasion that the first anode 23 shorts to the second anode 24. After the short or arc to ground, the resistance allows a relatively slow discharge, or gradual voltage equalization of anode 23 and electrode 32. In the embodiment illustrated, resistor 40 is a bored cylinder having, approximately, an outer radius 1¼ cm, a length 1 cm and an internal bore of ¼ cm radius. The particular glass composition chosen was EWD-553 as disclosed in the aforementioned patent application being filed concurrently herewith. This particular sample was chosen because of its characteristics (resistivity, etc.) with respect to the physical and electrical preferences of the intended use. It should be pointed out that another conductive glass such as disclosed in the above-mentioned application may exhibit more favorable properties for a different embodiment (either SEM or ion probe) which calls for different relative physical or electrical properties related to such as size, or voltage and resistance values.

The present combination of a field emission gun 10 having a bulk conductive glass resistor exhibits a variety of advantages. Since the resistor can be formed into an element 40 which is an integral symmetrical part of structure in the electron beam, the overall physical symmetry of the column is maintained. Such symmetry becomes increasingly more important as operating voltage and current values are increased to provide more versatile instruments and/or those of higher resolution. Non-symmetrical elements in the column can induce electrical interference with the electron beam 13 flow, by deviation of some or many of the charged particles causing astigmatism, aberrations, etc. All the reasons for such disturbances are not known, however, charging, ionization, local fields, etc. are frequently cited as causes of beam disturbance. Additionally, prior art (such as U.S. Pat. No. 3,634,684) recognizes the problems associated with interposing conductive elements in the varying field of a scanning electron microscope and the resultant eddy current problem.

As previously stated in application Ser. No. 225,970, an insulating member 31 is preferably disposed intermediate extraction electrode member 32 and anode 23. the $V_2O_5$ plus $MoO_3$ plus $P_2O_5$ is equal to about 70 to 90 wt.% of the total glass composition. Generally, the glass compositions will have:

A. About 70 to 90 wt.% of three essential ingredients consisting of about 27 to 50 wt.% of $V_2O_5$, about 38 to 65 wt.% of $MoO_3$, and about 11 to 29 wt.% of $P_2O_5$;

B. About 2 to 10 wt.% of at least one oxide selected from the group consisting of $Fe_3O_4$ and $Co_3O_4$; and C. About 3 to 20 wt.% of at least one oxide selected from the group consisting of BaO, $Al_2O_3$, and CaO.

The method of making such glass is described in the application being filed concurrently with this application.

The composition of such other glasses according to the present invention are given below in Table 1.

TABLE 1

| $R_mO_n$ | EWD-553 (wt.%) | EWD-552 (wt.%) | EWD-559 (wt.%) | EWD-560 (wt.%) | EWD-562 (wt.%) |
|---|---|---|---|---|---|
| $V_2O_5$ | 29.00 | 28.00 | 32.00 | 29.00 | 3.85 |
| $MoO_3$ | 37.00 | 37.00 | 41.00 | 37.00 | 39.36 |
| BaO | 8.00 | 12.98 | — | 12.00 | 8.51 |
| $Al_2O_3$ | — | 0.58 | 3.86 | — | — |
| $P_2O_5$ | 16.00 | 14.44 | 16.14 | 15.00 | 17.02 |
| $Fe_3O_4$ | 6.00 | 7.00 | 7.00 | 6.00 | — |
| CaO | 1.00 | — | — | 1.00 | 1.07 |
| $Co_3O_4$ | 3.00 | — | — | — | 3.19 |

With such an arrangement, in order to pass beam 13, insulator 31 must necessarily be apertured, e.g. 31a (FIG. 2). Even with previously described beam defining apertures (32a), there is a tendency for charged particles to strike the region of the insulator 31 surrounding aperture 31a. When there are such collisions, the affected regions of the insulator 31 may become electrostatically charged, which an influence the beam 13 (causing such as deflection or dispersion of the charged particles) and/or contamination of the region through ionization of inclusions in or on insulator 31. By incorporating a symmetrical conducting (but of high resistance to provide the above-described isolation) tube of glass 40 adjacent the beam, the material forming insulator 31 is physically removed from the effects of beam 13. Since the resistor 40 is a conductor, any charge which might tend to build on a portion of the resistor due to striking electrons, bleeds off, leaving the aperture 40a region relatively free of the effects of charging and beam 13 relatively unimpeded as it passes this congested region. Likewise, since resistor 40 is of high resistance, the prior art eddy current problem is eliminated.

While it is contemplated that other materials having the electrical and physical properties described as favorable in the foregoing description would be usable for the resistor 40, the materials described below constitute a preferred embodiment of the invention.

Glass compositions which are considered to be most favorable in the present invention include those consisting essentially of about 25 to 35 wt.% of $V_2O_5$, about 35 to 45 wt.% of $MoO_3$, about 10 to 20 wt.% of $P_2O_5$, up to about 15 wt.% of BaO, up to about 5 wt.% of $Al_2O_3$, up to about 10 wt.% $Fe_3O_4$, up to about 2 wt.% of CaO and up to about 4 wt.% of $Co_3O_4$. The total of Flat samples for electrical conductivity measurements have been taken from one end of test bars with the plane of the flat faces perpendicular to the long dimension of the bars, the experimental samples being from approximately 0.075 cm to 0.20 cm. in thickness.

For studies of the temperature dependence of the electrical conductivity of the samples, a sample holder, for both the glass specimen and a test circuit, may be placed in a vacuum oven and stabilized to equilibrium at the desired temperature. The conductivity of the sample at that temperature may then be measured. Measurements of conductivity have been made at a number of temperatures over the range of 24°C to 104°C.

Measurements of the electrical conductivity of the samples at low pressure have been made with the sample disposed where the pressure is about $3.5 \times 10^{-5}$ Torr, such as a bell jar in a vacuum system.

Additional electrical conductivity measurements have been made on annular samples having an inner diameter of about 0.6 cm, an outer diameter of 2.3 cm and a length of 1.1 cm. The electrical conductivity measurements were made at the low electrical field strengths. The methods of testing are disclosed in the aforementioned application being filed concurrently with this application.

Figure 3:
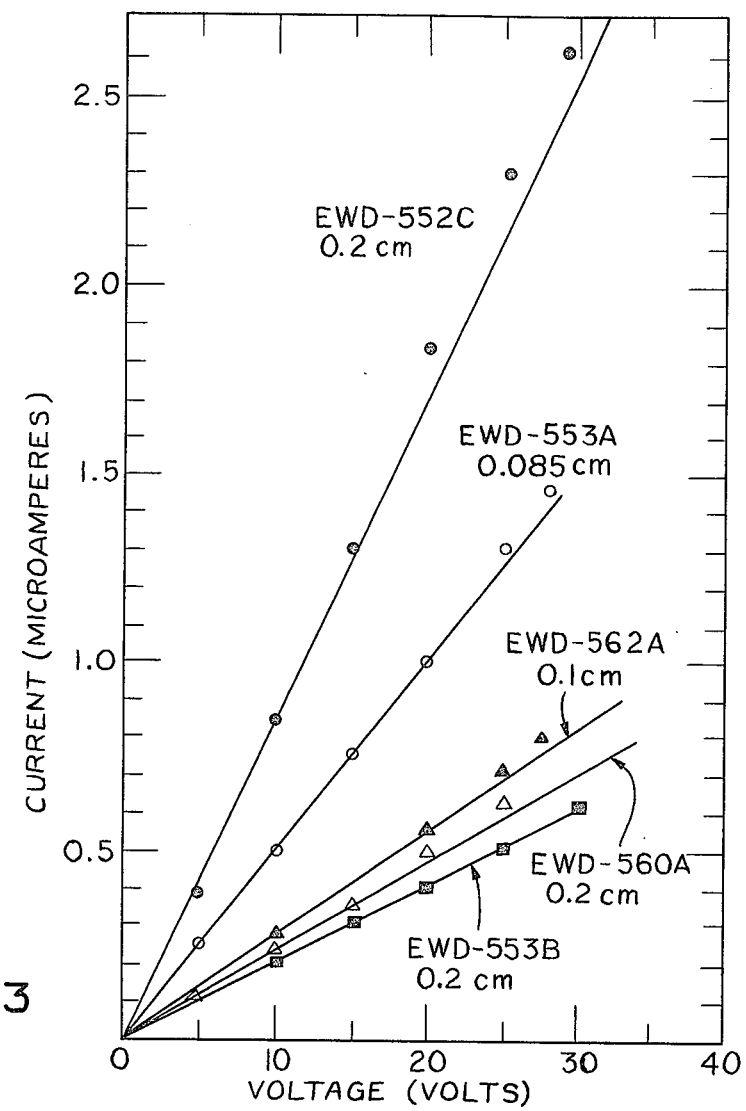
FIG. 3 is a graph showing current versus voltage for a number of semiconducting glasses used in the present invention.

The results of the electrical conductivity measurements at low electrical field strengths for the various samples of glass composition illustrated in Table 1 are shown in the graph of FIG. 3. The resistances which are calculated for each of the data points shown in FIG. 3 are given in the Table 2 below. The values of the resistances are given in megohms.

TABLE 2

| Composition | Sample Thickness (cm) | Voltage | | | | | |
| | | 5V | 10V | 15V | 20V | 25V | 28V |
|---|---|---|---|---|---|---|---|
| EWD-552C | 0.2 | 13.2 | 11.6 | 11.5 | 11.0 | 10.8 | 10.7 |
| EWD-553A | 0.085 | 20.8 | 20.0 | 20.0 | 20.0 | 19.2 | 19.2 |

TABLE 2-continued

| Composition | Sample Thickness (cm) | Voltage | | | | | |
|---|---|---|---|---|---|---|---|
| | | 5V | 10V | 15V | 20V | 25V | 28V |
| EWD-553B | 0.2 | 50.0 | 52.6 | 52.0 | 51.3 | 50.0 | 49.3 |
| EWD-560A | 0.2 | 48.0 | 45.0 | 44.0 | 41.0 | 40.0 | — |
| EWD-562A | 0.1 | 38.4 | 37.0 | 41.7 | 37.8 | 36.3 | 36.0 |

As seen from Table 2 and FIG. 3, the resistance property of the samples measured may be non-ohmic in nature. For certain samples such as the sample EWD-553, a relatively strong nonlinearity in the resistance is observed with increasing voltage up to a threshold voltage. With increasing voltage, the current is observed to increase by an amount greater than that which is predicted by Ohm's Law. Beyond a specific voltage, the current is observed to rise rapidly to an initial value and thereafter, is observed to creep slowly up to a final equilibrium value.

Figure 4:
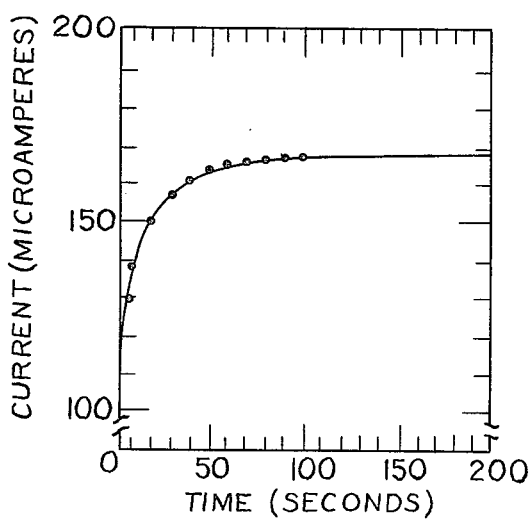
FIG. 4 is a graph of current versus time for one semiconducting glass used in the present invention.
Figure 5:
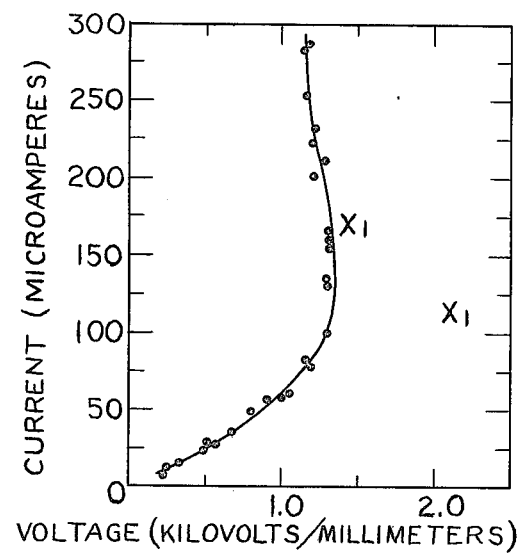
FIG. 5 is a graph of the equilibrium current plotted against the equilibrium voltage for a semiconducting glass according to the present invention.

The voltage current plot of sample EWD-553A, obtained at high electrical field strengths, is shown in FIG. 5. The data points correspond to the final equilibrium values observed. A strong non-linearity begins to occur at field strengths which the glass can hold off or sustain until about 13,000V/cm. The data points labelled $x_1$ and $x_f$ in FIG. 5 correspond to the initial and final values, respectively, of the current and electric field strength for the data shown in FIG. 4. The resistivities of the samples are calculated from the slopes of the straight lines in the current versus voltage plot shown in FIG. 3, in ambient air, at room temperature, and are listed below in Table 3.

TABLE 3

| Composition | Resistivity (ohm.cm) | Thickness (cm) |
|---|---|---|
| 552C | $6.0 \times 10^7$ | 0.2 |
| 553A | $2.5 \times 10^8$ | 0.085 |
| 553B | $2.8 \times 10^8$ | 0.2 |
| 560A | $2.2 \times 10^8$ | 0.2 |
| 562A | $5.1 \times 10^8$ | 0.1 |

The resistivity of glass sample EWD-553A, as measured at a pressure of $3.5 \times 10^{-5}$ Torr was found to be $2.2 \times 10^8$ ohm.cm at 5V DC. This value compares with the value $2.5 \times 10^8$ ohm.cm measured for the same sample in ambient air. The small difference observed may be due to measurement errors or differences in temperature of the sample at the time of measurement.

The results of the study of temperature dependence of the resistivity on sample EWD-553A are summarized in the aforementioned application.

The resistivities of all the glasses tested are found to be within the range expected for the microprobe application. For the samples of formula EWD-552, it is found that the electrical puncture voltage for a 1 mm thick sample was 1.6 kV for several minutes at the voltage. Whereas, a 0.085 centimeter thick specimen of EWD-553 holds off the same voltage for several minutes. Therefore, EWD-553 would seem to be advantageous for the application of a leakage resistor for an electron microscope. For this sample, a negative temperature coefficient of resistance of about −2.8%/degree C at 25°C is found. In addition, it is found that the resistivity of the samples of formula EWD-553 are described by the arrhenius equation over the temperature range of from 22°C to 104°C.

$$P = P_o e^{E*/Kt}$$

Where P is a resistivity, $P_o$ is a constant, $E$ is a so-called activation energy for conduction, $k$ is the Boltzmann factor.

The activation energy for conduction, $E$, is found to be about $0.5 eV$. The conduction mechanism may be considered to be ionic if $0.7 \, eV \, E = 2.4 \, eV$ and electronic if $E = 0.7 \, eV$. It seems apparent that the primary conduction mechanism in the semiconducting glasses is electronic.

It should be thus recognized that the advance of the present invention has remarkably improved the performance of field emission microprobes. It should also be noted that many embodiments of the present invention may be utilized in microprobes other than the specific embodiment disclosed, but still remaining within the full spirit and scope of the present invention. With the foregoing in mind,

I claim:

1. A charged particle microprobe system comprising:
    a housing defining a vacuum chamber;
    a field emission tip disposed in said chamber for generating charged particles;
    apertured electrode means disposed in said chamber for establishing a focusing and accelerating electrical field for forming a beam of said charged particles;
    means for deflecting said beam in a predetermined raster pattern;
    apertured field electrode means disposed in said chamber intermediate said field emission tip and said electrode means for developing an electric field for generating said charged particles, said apertures of said electrode means and field electrode means being axially aligned with said field emission tip;
    voltage supply means connected to said electrode means, said field electrode means and said field emission tip for supplying electrical potential to establish said electrical fields; and
    a non-magnetic resistive conductor being generally physically and electrically symmetrical about an axis disposed intermediate said field electrode means and said electrode means with its axis generally aligned with the axis of said apertured electrode and in electrical contact therewith, said member being formed of a material having a substantially uniform cross-sectional conductivity and a predetermined value of resistance over its axial extent whereby said resistance conductor provides a leakage resistance path substantially free of eddy currents.

2. The charged particle microprobe according to claim 1 wherein said resistive conductor is a cylindrical member having an axial aperture therein.

3. The charged particle microprobe according to claim 1 wherein said resistive conductor is a cylindrical member having an axial aperture therein and said conductor is formed of a conductive glass material.

4. The charged particle microprobe according to claim 3 wherein said conductive glass material has a composition consisting essentially of about 70 to 90 weight percent of the essential ingredients $V_2O_5$, $MoO_3$, and $P_2O_5$;

the $V_2O_5$ being present in an amount ranging from 27.8 to 50 weight percent of the essential ingredients;

the $MoO_3$ being present in an amount ranging from 38.9 to 64.3 weight percent of the essential ingredients; and the $P_2O_5$ being present in an amount ranging from 11.3 to 28.6 weight percent of the essential ingredients;

about 20 to 10 weight percent of at least one modifying oxide selected from the group consisting of $Fe_3O_4$ and $Co_3O_4$; and about 3 to 20 weight percent of at least one modifying oxide selected from the group consisting of BaO, $Al_2O_3$ and CaO.

* * * * *